United States Patent
Frohberg et al.

(10) Patent No.: US 7,902,581 B2
(45) Date of Patent: Mar. 8, 2011

(54) SEMICONDUCTOR DEVICE COMPRISING A CONTACT STRUCTURE BASED ON COPPER AND TUNGSTEN

(75) Inventors: Kai Frohberg, Niederau (DE); Carsten Peters, Dresden (DE); Thomas Werner, Reichenberg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 931 days.

(21) Appl. No.: 11/428,611

(22) Filed: Jul. 5, 2006

(65) Prior Publication Data

US 2007/0099414 A1    May 3, 2007

(30) Foreign Application Priority Data

Oct. 31, 2005   (DE) .......................... 10 2005 052 000

(51) Int. Cl.
*H01L 27/108* (2006.01)
*H01L 29/94* (2006.01)
*H01L 21/4763* (2006.01)

(52) U.S. Cl. .................. 257/296; 438/618; 257/E21.62; 257/E21.641

(58) Field of Classification Search .................. 257/296, 257/597, E21.62, E21.627, E21.641; 438/618, 438/629, 689, 300
See application file for complete search history.

(56) References Cited

U.S. PATENT DOCUMENTS

| | | | | |
|---|---|---|---|---|
| 6,001,683 A | 12/1999 | Lee | | 438/241 |
| 6,130,449 A * | 10/2000 | Matsuoka et al. | | 257/296 |
| 6,172,387 B1 * | 1/2001 | Thakur et al. | | 257/296 |
| 6,211,085 B1 | 4/2001 | Liu | | 438/687 |
| 6,229,186 B1 * | 5/2001 | Ishida | | 257/390 |
| 6,274,409 B1 | 8/2001 | Choi | | 438/128 |
| 6,661,097 B1 | 12/2003 | Clevenger et al. | | 257/763 |
| 2003/0003733 A1 * | 1/2003 | Ohashi et al. | | 438/689 |
| 2005/0133920 A1 | 6/2005 | Liou et al. | | 257/758 |
| 2005/0277258 A1 * | 12/2005 | Huang et al. | | 438/300 |

FOREIGN PATENT DOCUMENTS

DE    103 05 365 A1    8/2004 .................. 21/283

\* cited by examiner

*Primary Examiner* — Walter L Lindsay, Jr.
(74) *Attorney, Agent, or Firm* — Williams, Morgan & Amerson, P.C.

(57) ABSTRACT

By providing contact plugs having a lower plug portion, formed on the basis of well-established tungsten-based technologies, and an upper plug portion, which may comprise a highly conductive material such as copper or a copper alloy, a significant increase in conductivity of the contact structure may be achieved. For this purpose, after the deposition of a first dielectric layer of the inter-layer stack, a planarization process may be performed so as to allow the formation of the lower plug portions on the basis of tungsten, while, after the deposition of the second dielectric layer, a corresponding copper-based technology may be used for forming the upper plug portions of significantly enhanced conductivity.

37 Claims, 7 Drawing Sheets

SEMICONDUCTOR DEVICE COMPRISING A CONTACT STRUCTURE BASED ON COPPER AND TUNGSTEN

BACKGROUND OF THE INVENTION

1. Field of the Invention

The present invention relates to the field of semiconductor manufacturing, and, more particularly, to the formation of an interconnect structure having a contact plug for directly contacting a circuit element.

2. Description of the Related Art

Semiconductor devices, such as advanced integrated circuits, typically contain a huge number of circuit elements, such as transistors, capacitors, resistors and the like, which are usually formed in a substantially planar configuration on an appropriate substrate having formed thereon a crystalline semiconductor layer. Due to the large number of circuit elements and the required complex layout of modern integrated circuits, the electrical connections of the individual circuit elements may generally not be established within the same level on which the circuit elements are manufactured but require one or more additional "wiring" layers, which are also referred to as metallization layers. These metallization layers generally include metal-containing lines, providing the inner-level electrical connection, and also include a plurality inter-level connections, which are also referred to as "vias," that are filled with an appropriate metal and provide the electrical connection between two neighboring stacked metallization layers.

Due to the continuous reduction of the feature sizes of circuit elements in modern integrated circuits, the number of circuit elements for a given chip area, that is, the packing density, also increases, thereby requiring an even larger increase in the number of electrical connections to provide the desired circuit functionality. Therefore, the number of stacked metallization layers usually increases as the number of circuit elements per chip area becomes larger and/or the sizes of individual metal lines and vias are reduced. Due to the moderately high current densities that may be encountered during the operation of advanced integrated circuits, and owing to the reduced feature size of metal lines and vias, semiconductor manufacturers are increasingly replacing the well-known metallization materials, such as aluminum, by a metal that allows higher current densities and, hence, permits a reduction in the dimensions of the interconnections. Consequently, copper and alloys thereof are materials that are increasingly used in the fabrication of metallization layers, due to the superior characteristics in view of resistance against electromigration and the significantly lower electrical resistivity compared to, for instance, aluminum. Despite these advantages, copper also exhibits a number of disadvantages regarding the processing and handling of copper in a semiconductor facility. For instance, copper readily diffuses in a plurality of well-established dielectric materials, such as silicon dioxide, wherein even minute amounts of copper accumulating at sensitive device regions, such as contact regions of transistor elements, may lead to a failure of the respective device. For this reason, great efforts have to be made to reduce or avoid any copper contamination during the fabrication of the transistor elements, thereby rendering copper a less attractive candidate for the formation of contact plugs, which are in direct contact with respective contact regions of the circuit elements. The contact plugs provide the electrical contact of the individual circuit elements to the first metallization layer, which is formed above an inter-layer dielectric material that encloses and passivates the circuit elements.

Consequently, in advanced semiconductor devices, the respective contact plugs are typically formed of a tungsten-based metal that are formed in an inter-layer dielectric stack, typically comprised of silicon dioxide that is formed above a corresponding bottom etch stop layer, which may typically be formed of silicon nitride. Due to the ongoing shrinkage of feature sizes, however, the respective contact plugs have to be formed within respective contact openings with an aspect ratio which may be as high as approximately 8:1 or more, wherein a diameter of the respective contact openings may be 0.1 μm or even less for transistor devices of the 90 nm technology or the 65 nm technology. The aspect ratio of such openings is generally defined as the ratio of the depth of the opening to the width of the opening. Consequently, the resistance of the respective contact plugs may significantly restrict the overall operating speed of highly advanced integrated circuits, even though a highly conductive material, such as copper or copper alloys, may be used in the metallization layers.

In view of the situation described above, there exists a need for an enhanced technique that enables the formation of contact plugs having a reduced contact resistance while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique enabling the formation of highly conductive contact plugs by combining well-approved contact technologies on the basis of, for instance, tungsten and copper-based technologies, thereby significantly reducing the overall resistance of the contact plugs. For this purpose, contact plugs may be formed by providing well-approved materials in the vicinity of the sensitive contact regions of circuit elements, while, in a second step, a highly conductive material, such as copper or alloys thereof, may be used for forming an upper portion of the contact plug. Consequently, the risk of copper contamination of sensitive device areas is maintained at a lower level while simultaneously a significantly reduced electrical resistance is obtained, since an essential portion of the contact plug is comprised of the highly conductive metal.

According to one illustrative embodiment of the present invention, a semiconductor device comprises a circuit element having a contact region and a contact plug that is formed in a dielectric layer stack that is located between the circuit element and a first metallization layer. The contact plug comprises a lower plug portion connecting to the contact region and also comprises an upper plug portion formed on the lower plug portion and comprising copper.

According to a further illustrative embodiment of the present invention, a method comprises forming a first dielectric layer above a circuit element, which comprises a contact region. The method further comprises planarizing the first dielectric layer and forming a lower plug portion of a contact plug in the first dielectric layer. Moreover, the method comprises forming a second dielectric layer above the first dielectric layer and forming a copper-comprising upper plug portion in the second dielectric layer.

BRIEF DESCRIPTION OF THE DRAWINGS

The invention may be understood by reference to the following description taken in conjunction with the accompanying drawings, in which like reference numerals identify like elements, and in which.

Figure 1A:
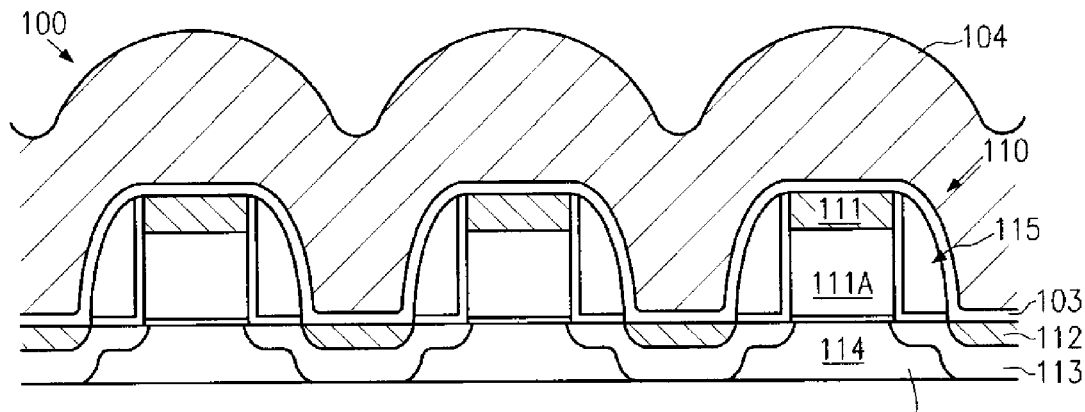
FIGS. 1a-1h schematically show cross-sectional views of a semiconductor device during various manufacturing stages for forming highly conductive contact plugs according to illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to a technique for the formation of contact plugs, i.e., metal-filled vias which provide the electrical connection between the respective contact regions of circuit elements with an overlying metallization layer, wherein advanced copper-based technologies may be used in combination with well-approved contact materials to enhance the electrical performance of the contact plugs while maintaining the probability of copper contamination of the circuit elements at a low level. For this purpose, a lower portion of the contact plug may be formed on the basis of, for instance, tungsten, while an upper portion of the contact plug may be formed on the basis of a copper technology, wherein the first dielectric layer of an inter-layer dielectric layer stack is first planarized after the deposition to provide a substantially planar surface topography, which then allows first patterning a lower portion of the contact plugs on the basis of established materials, such as tungsten, tungsten nitride, tungsten silicide and the like. Thereafter, the upper portion of the inter-layer dielectric layer stack may be deposited and correspondingly patterned on the basis of copper technologies to provide the essential part of the entire contact plug in the form of a copper-based via having a significantly reduced resistance compared to a conventional tungsten-based via having essentially the same dimensions.

It should be appreciated that the present invention is highly advantageous in combination with integrated circuits having formed therein circuit elements with critical dimensions, for instance, the gate length of respective field effect transistors, on the order of magnitude of 50 nm or even less, since here the formation of a conventional contact etch stop layer may result in a respective surface topography that may permit a planarization process and a subsequent patterning process prior to the deposition of the actual inter-layer dielectric material. As will be described later, the present invention may, however, also be applied in combination with integrated circuits having larger circuit elements, wherein a corresponding planarization step may be performed after the deposition of a first portion of the inter-layer dielectric material to form lower contact plug portions therein, wherein, thereafter, the remaining inter-layer dielectric material may be deposited and patterned on the basis of a copper damascene technique. Consequently, the present invention should not be considered as being restricted to integrated circuits having formed therein transistor elements with a gate length of 50 nm or even less, unless such restrictions are explicitly set forth in the following detailed description as well as in the appended claims.

With reference to FIGS. 1a-1h and 2a-2h, further illustrative embodiments of the present invention will now be described in more detail. FIG. 1a schematically shows a cross-sectional view of a semiconductor device 100 in an advanced manufacturing stage. The semiconductor device 100 may comprise a substrate 101, which may represent any appropriate substrate for forming thereon and therein circuit elements, such as transistors, capacitors, resistors and the like. In illustrative embodiments, the substrate 101 may represent a silicon-on-insulator (SOI) substrate having formed thereon a silicon-based semiconductor layer 102. In other illustrative embodiments, the substrate 101 may represent a bulk silicon substrate or any other semiconductor substrate or carrier material on which is formed the semiconductor layer 102. The semiconductor device 100 may further comprise one or more circuit elements 110, each of which comprises at least one contact region 112 that is to be contacted by a corresponding contact plug to establish an electrical connection to one or more metallization layers that are to be formed above the one or more circuit elements 110. In the illustrative embodiment shown in FIG. 1a, the one or more circuit elements 110 may represent field effect transistors including a gate electrode 111A, which may also comprise a contact region 111. Moreover, a spacer structure 115 may be provided at sidewalls of the gate electrode 111A. Furthermore, drain and source regions 113 may be formed within the semiconductor layer 102 with a corresponding channel region 114 disposed between respective drain and source regions 113. Thus, the at least one contact region 112 may represent a portion of a respective drain and source region 113. It should be appreciated that the circuit element 110 may also represent other circuit elements, such as conductive lines, for instance provided as polysilicon lines, capacitors and the like. Moreover, the circuit element 110, when representing a field effect transistor, may not be restricted to the architecture as shown in FIG. 1a, but is to represent any appropriate transistor configuration, such as transistors having raised drain and source regions (not shown), transistors having a fin-like gate structure (FinFET), fully or partially depleted SOI transistors, SOI transistors formed on a very thin semiconductor layer and the like. In illustrative embodiments, the circuit elements 110, when representing field effect transistors, may have a gate length, i.e., in FIG. 1a, the horizontal extension of the gate electrode 111A, of 50 nm or even less.

A first dielectric layer 104 is formed above the circuit elements 110, wherein the first dielectric layer 104 is provided with a surface topography that at least completely fills any spaces between the circuit elements 110, thereby enabling a subsequent planarization of the first dielectric layer 104, substantially without affecting the integrity of the circuit elements 110. In one illustrative embodiment, the first dielectric layer 104 may be provided in the form of a silicon nitride layer, as is also typically used in conventional techniques, wherein the silicon nitride layer may be provided as a contact etch stop layer for controlling the patterning process for an inter-layer dielectric material that is typically deposited on the contact etch stop layer. In illustrative embodiments of the present invention, the first dielectric layer 104 may be provided in the form of any appropriate dielectric material, wherein the layer 104 may not necessarily exhibit a specific etch selectivity with respect to a subsequently deposited inter-layer dielectric material. For example, the first dielectric layer 104 may be comprised of the same or similar materials as the inter-layer dielectric material still to be formed.

In one illustrative embodiment, the first dielectric layer 104 may be provided as a stress-inducing layer, which may comprise compressive or tensile stress, depending on the device requirements. As is well known, a certain strain in a crystalline semiconductor material may significantly change the charge carrier mobility therein. For example, for silicon-based semiconductor devices, a certain amount of strain may significantly modify the charge carrier mobility and, thus, the drive current capability of the respective device. For instance, by providing tensile strain in the channel region 114, the charge carrier mobility of electrons may be significantly increased, thereby achieving a high gain in performance for corresponding N-channel transistors. On the other hand, by providing a compressive strain in the channel region 114, when representing a P-channel transistor, a significant increase of the whole mobility may be achieved, thereby significantly enhancing the transistor performance. Consequently, by providing the first dielectric layer 104 as a stress-inducing layer, i.e., as a layer comprising a significant amount of inherent stress, which acts as a source for creating the desired strain in the channel regions 114, a significant increase in performance may be achieved. For example, silicon nitride may be deposited as a layer having compressive or tensile stress, depending on the specific deposition parameters. Moreover, it should be appreciated that the first dielectric layer 104, when provided as a stress-inducing layer, may be provided with different intrinsic stress for different circuit elements, thereby individually enhancing the performance of the respective circuit elements 110. In other illustrative embodiments, the intrinsic stress of the layer 104 may be varied on a more global scale, thereby imparting a different type or amount of stress at different die areas.

Moreover, in one illustrative embodiment, a liner 103 may be provided to separate the circuit elements 110 from the dielectric layer 104. The liner 103 may be formed of a material that exhibits a high etch selectivity with respect to the material of the first dielectric layer 104. For instance, the liner 103 may be provided as a silicon dioxide layer, when the material of the layer 104 is substantially comprised of silicon nitride.

A process flow for forming the semiconductor device 100 as shown in FIG. 1a may comprise the following processes. The circuit elements 110 may be formed in accordance with well-established process techniques, involving advanced deposition and patterning processes on the basis of highly advanced photolithography and etch techniques. For example, after the formation of any isolation structures (not shown) and the creation of a respective dopant profile within the semiconductor layer 102, the gate electrodes 111A, in combination with respective gate insulation layers, may be patterned in accordance with design requirements, wherein the distance between neighboring circuit elements 110 may be in the range of a few hundred nm or even less. Thereafter, the sidewall spacer structure 115 may be formed, wherein, intermittently, any implantation processes may be performed to create the required lateral dopant profile for forming the drain and source regions 113. It should be appreciated that the formation of the circuit elements 110 may also include advanced epitaxial growth techniques to provide raised drain and source regions and/or stress-inducing sources, for instance, strained or relaxed semiconductor materials of different lattice spacing compared to the basis material of the layer 102, within the drain and source regions 113 and/or within the channel region 114. For convenience, any such strain-inducing mechanisms are not illustrated in FIG. 1a.

Thereafter, the contact regions 111 and 112 may be formed, wherein, in some illustrative embodiments, advanced silicidation processes may be performed to form a highly conductive metal silicide in the contact regions 111 and 112. In one illustrative embodiment, one or both of the regions 111 and 112 may comprise nickel silicide, which exhibits a significantly enhanced conductivity compared to cobalt silicide, titanium silicide and the like. After the formation of the respective contact regions 111 or 112, the liner 103 may be deposited on the basis of well-established plasma enhanced chemical vapor deposition (PECVD) techniques and, thereafter, the first dielectric layer 104 may be deposited, for instance by PECVD. As previously explained, during the deposition of the first dielectric layer 104, the corresponding layer thickness may be selected such that a reliable overfill of the respective spaces between the individual circuit elements 110 may be achieved. For example, in highly advanced integrated circuits having critical dimensions as specified above, a deposition thickness of approximately 100-200 nm may lead to a surface topography as is illustrated in FIG. 1a. In other illustrative embodiments, the layer thickness 104 may be selected so as to obtain the desired degree of overfill of the spaces between the circuit elements 110.

As previously explained, in some embodiments, the layer 104 may be deposited on the basis of appropriately selected deposition parameters to provide a certain type and amount of intrinsic stress. In still other embodiments, the layer 104 may be deposited as one or more layers in order to provide the desired type and amount of stress within the semiconductor device 100 in a highly local fashion. For example, a compressive or tensile layer may be deposited first and subsequently this layer may be selectively removed from specific device portions. Thereafter, a tensile or compressive layer may be deposited to provide the desired type and amount of stress in the exposed device portions. For this purpose, the liner 103 may act as an etch stop layer during the selective removal of the initially deposited layer. Since the layer 104, when deposited in the form of two or more differently stressed layers, may be planarized after the deposition, in some illustrative embodiments, both layers may be deposited to provide the desired overfill, wherein any excess material of the second layer, which is deposited on the first layer in some device areas, may be removed in the subsequent planarization process. In still other illustrative embodiments, the first dielectric layer 104 may be provided in the form or two or more individual layers, wherein, for instance, a first layer may have respective etch and/or stress characteristics, while the second layer may represent an inter-layer dielectric material for passivating the circuit elements 110, wherein the second layer is provided to insure the required overfilling of the respective spaces between the circuit elements 110. After the deposition of the first dielectric layer 104 with the required layer thickness, a planarization process is performed, for instance on the basis of an appropriate chemical mechanical polishing (CMP) recipe. For example, corresponding process techniques for silicon nitride, silicon dioxide and the like are well-established in the art and may be used in combination with the present invention to planarize the first dielectric layer 104.

Figure 1B:
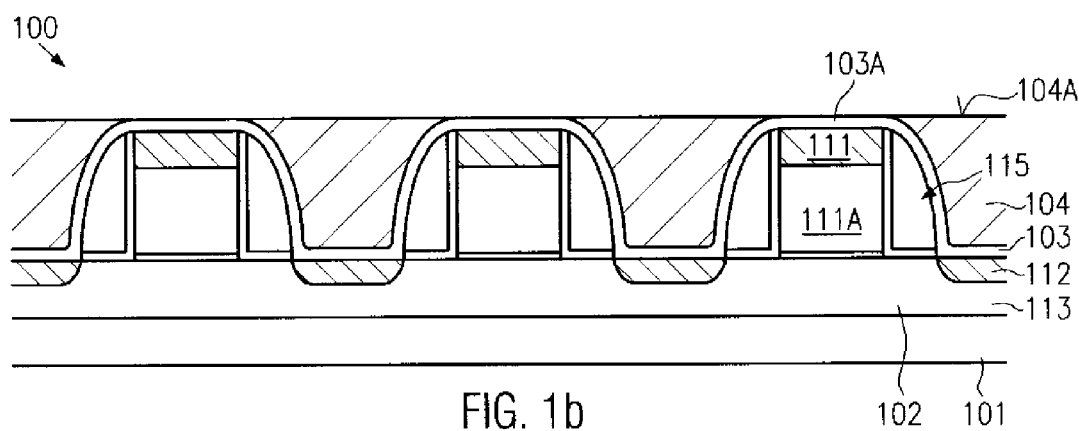

FIG. 1b schematically shows the semiconductor device 100 after the above-described process sequence is completed. Hence, the device 100 comprises a substantially planarized surface 104A, wherein, in some illustrative embodiments, the contact regions 111 may be exposed, as will be described later with reference to FIGS. 2a-2h. In other illustrative embodiments, as shown in FIG. 1b, during the CMP process for planarizing the surface typography of the layer 104, the liner 103 may act as a CMP stop layer, which may indicate the end of the CMP process. Depending on the thickness of the layer 103, a certain residual layer 103A may still be maintained on the device 100 after the completion of the CMP process. Consequently, the substantially planar surface 104A is now composed of a plurality of surface portions 103A covering the top faces of the circuit elements 110, i.e., the contact regions 111, while the remaining portions of the layer 104 form the surface portions 104A above the spaces between the circuit elements 110, in which corresponding contact plugs are to be formed down to the respective contact regions 112. In some illustrative embodiments, the substantially planar surface 104A, including the surface portions 103A, may be formed by CMP and/or may be formed by a selective etch process, wherein, for example, an initial CMP process may be carried out to substantially planarize the surface topography of the layer 104 as shown in FIG. 1a, and subsequently a selective etch process may be performed, in which the surface portions 103A may serve as etch stop or etch indicators, efficiently signaling the end of the etch process. In still other embodiments, the layer 104, as shown in FIG. 1a, may be planarized by a corresponding etch process, wherein the surface topography is first planarized by the deposition of an appropriate material, which is formed in a highly non-conformal fashion to define a substantially planar surface, wherein an etch rate of the additional planarizing material is similar to the etch rate of the first dielectric 104. Subsequently, a selective etch process may be performed, the end of which may be signaled by the exposure of the surface portions 103A, wherein, in illustrative embodiments, the etch process is highly selective to the layer 103.

Figure 1C:
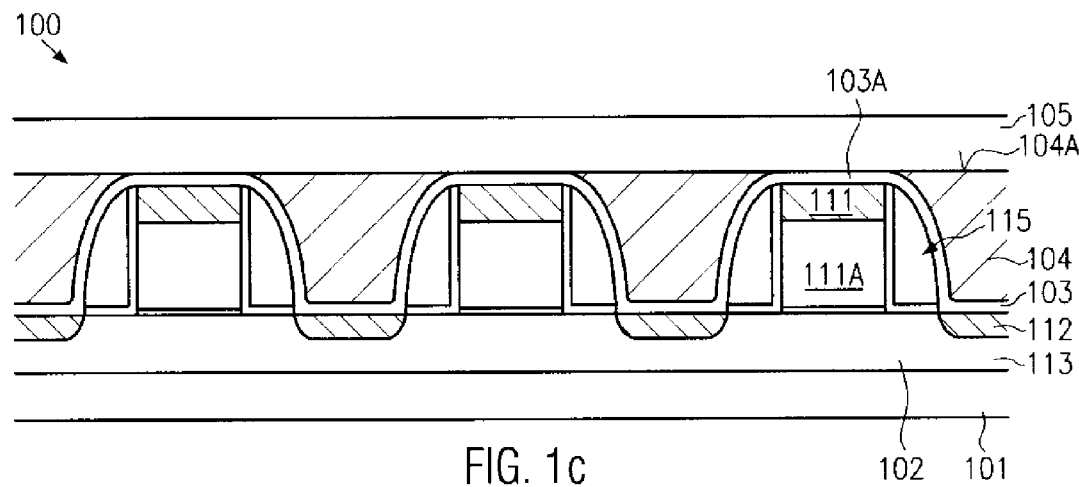

FIG. 1c schematically shows the semiconductor device 100 in a further advanced manufacturing stage. Here, a buffer layer 105 is formed on the planarized first dielectric layer 104 and on the contact regions 111 covered by the layer portions 103A. The buffer layer 105 may have a thickness of approximately 20-100 nm, depending on device requirements. As previously explained, forming a copper-containing contact in the immediate vicinity of highly sensitive circuit elements, such as the transistors 110, may bear the probability of an undue copper diffusion into the respective device regions, for instance, into the contact regions 111 and 112, thereby forming copper silicide, which may result in a device failure. Thus, in illustrative embodiments, the buffer layer 105 is provided which insures a certain "safety margin" to form therein a lower portion of a contact plug, thereby avoiding a direct application of a copper-based contact technology in the immediate vicinity of the contact regions 111.

In some illustrative embodiments, the buffer layer 105 may be comprised of the same materials as the layer 104, wherein, as previously explained, the buffer layer 105 may also be formed with a specific type of intrinsic stress, or, in other illustrative embodiments, the buffer layer 105 may be deposited as a substantially non-stressed layer, when the stress-inducing mechanism provided by the rest of the layer 104 is considered appropriate.

Next, a resist mask (not shown) may be formed above the buffer layer 105 on the basis of well-established photolithography techniques, wherein additional anti-reflective coating (ARC) layers may also be used as prescribed by design and device requirements. The resist mask may expose portions of the buffer layer 105, in which corresponding contact openings for the contact regions 111 and 112 are to be formed in the buffer layer 105 and, for the contact regions 112, within the first dielectric layer 104. Thereafter, an anisotropic etch process on the basis of well-established recipes may be performed in order to actually form the respective contact openings, wherein the anisotropic etch process may, in one illustrative embodiment, be defined such that a high etch selectivity with respect to the material of the layer 103 and the surface portions 103A is obtained. For example, well-established anisotropic etch processes for selectively removing silicon nitride on the basis of an etch stop layer comprised of silicon dioxide are available and may be used for this purpose. Consequently, the etch front, when reaching the surface portions 103A may be stopped, thereby avoiding undue damage within the contact regions 111, while the etch front advances to the contact regions 112 until the etch stop layer 103 is reached. Thereafter, the exposed portions of the layer portions 103A and the etch stop layer 103 may be opened by a corresponding selective etch process, which may not unduly affect the underlying contact regions 111 and 112.

Figure 1D:
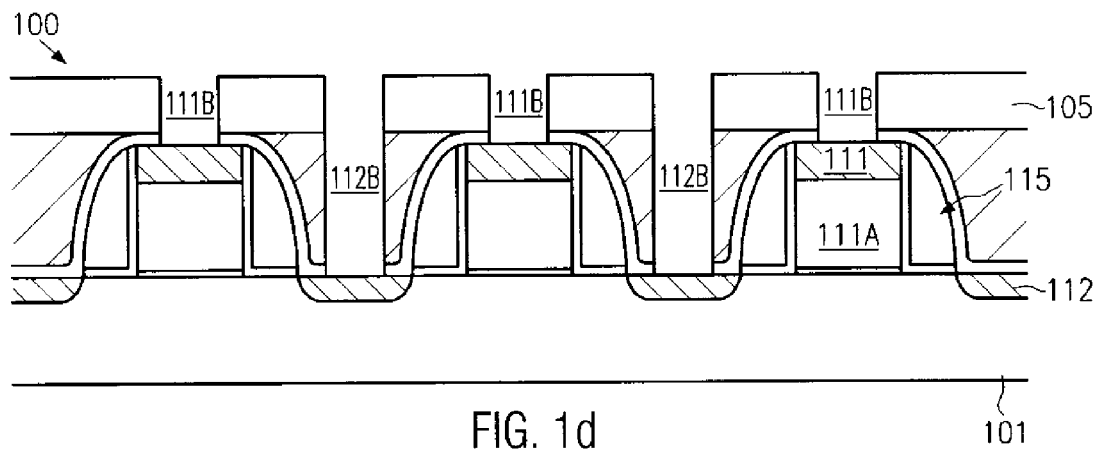

FIG. 1d schematically shows the semiconductor device 100 after the above-described process sequence. Hence, the device 100 comprises respective contact openings 111B formed above the respective contact regions 111 and contact openings 112B formed above the contact regions 112.

Figure 1E:
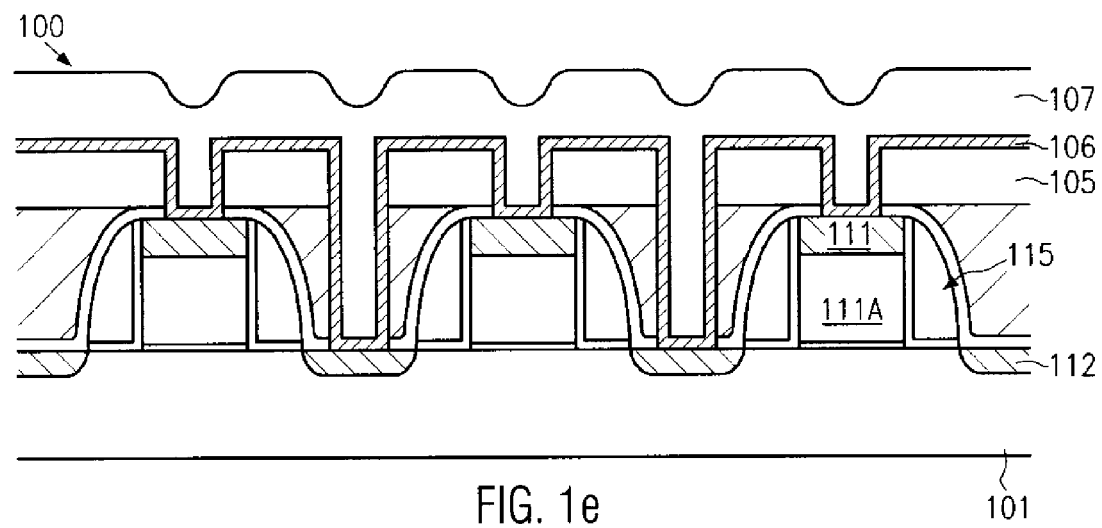

FIG. 1e schematically shows the semiconductor device 100 in a further advanced manufacturing stage. A conductive barrier layer 106 is formed on the layer 105 and within the respective contact openings 111B, 112B, wherein, depending on device and process requirements, the barrier layer 106 may be comprised of titanium, titanium nitride, tungsten, tungsten nitride and the like. For example, frequently in combination with a tungsten fill material, a titanium/titanium nitride barrier layer is used in order to reliably prevent an interaction with the dielectric material during the subsequent tungsten deposition, which is frequently performed on the basis of tungsten hexafluorine ($WF_6$). In still other process regimes, a tungsten nitride layer may be deposited, for instance, by advanced atomic layer deposition (ALD) techniques, wherein other barrier materials may be used in combination with the tungsten nitride. Moreover, a metal layer 107, which may be comprised in one illustrative embodiment of tungsten, may be formed on the barrier layer 106 in such a way that the contact openings 111B and 112B are reliably filled with conductive material. Thereafter, any excess material of the metal layer 107 and the barrier layer 106 may be removed, for instance by well-established CMP processes.

Figure 1F:
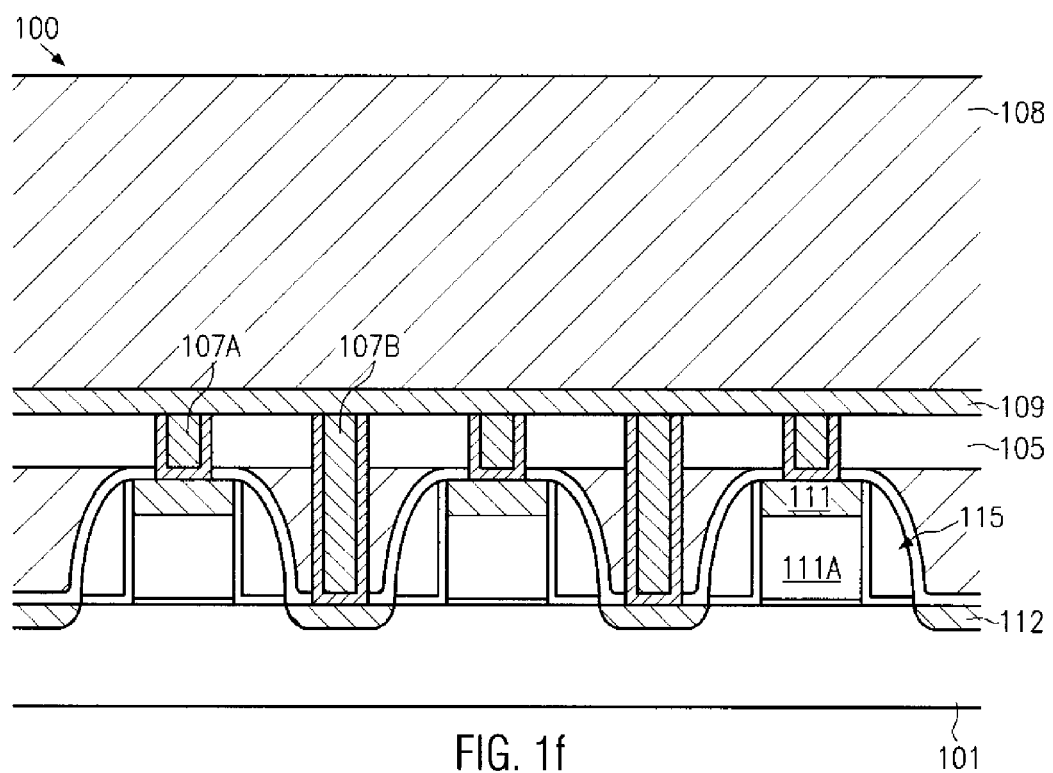

FIG. 1f schematically shows the semiconductor device 100 in a further advanced manufacturing stage. As shown, the semiconductor device 100 comprises respective lower plug portions 107A and 107B, which are formed, respectively, on the contact regions 111 and 112. A lower plug portion is to be understood as extending up to approximately 500 nm or less above the contact point to the contact region 111, 112 Moreover, a second dielectric layer 108, which may be comprised of any appropriate inter-layer dielectric material, such as silicon dioxide, is formed above the buffer layer 105 and the lower plug portions 107A and 107B. In one illustrative embodiment, an additional etch stop layer 109 may be formed between the buffer layer 105 and the second dielectric layer 108, wherein the etch stop layer 109 may be comprised of, for instance, silicon nitride, silicon carbide, nitrogen-enriched silicon carbide and the like.

The second dielectric layer 108 and, if provided, the etch stop layer 109 may be deposited on the basis of well-established recipes. For instance, the etch stop layer 109 may be formed by PECVD, followed by a sub-atmospheric or high density plasma enhanced deposition technique on the basis of TEOS for forming the second dielectric layer 108, when comprised of silicon dioxide. Thereafter, a corresponding photolithography process may be carried out in order to form a corresponding resist mask for patterning the second dielectric layer 108. To this end, similar process techniques and photolithography masks may be used as previously employed for the patterning of the buffer layer 105. Based on the corresponding resist mask, an appropriate anisotropic etch process may be performed, which may then be reliably stopped on the etch stop layer 109, if provided, or, in other illustrative embodiments, the etch process may be performed selectively to the material of the respective lower plug portions 107A, 107B, wherein a certain material removal during the anisotropic etch process may not be critical due to the process margin provided by the thickness of the buffer layer 105.

Figure 1G:
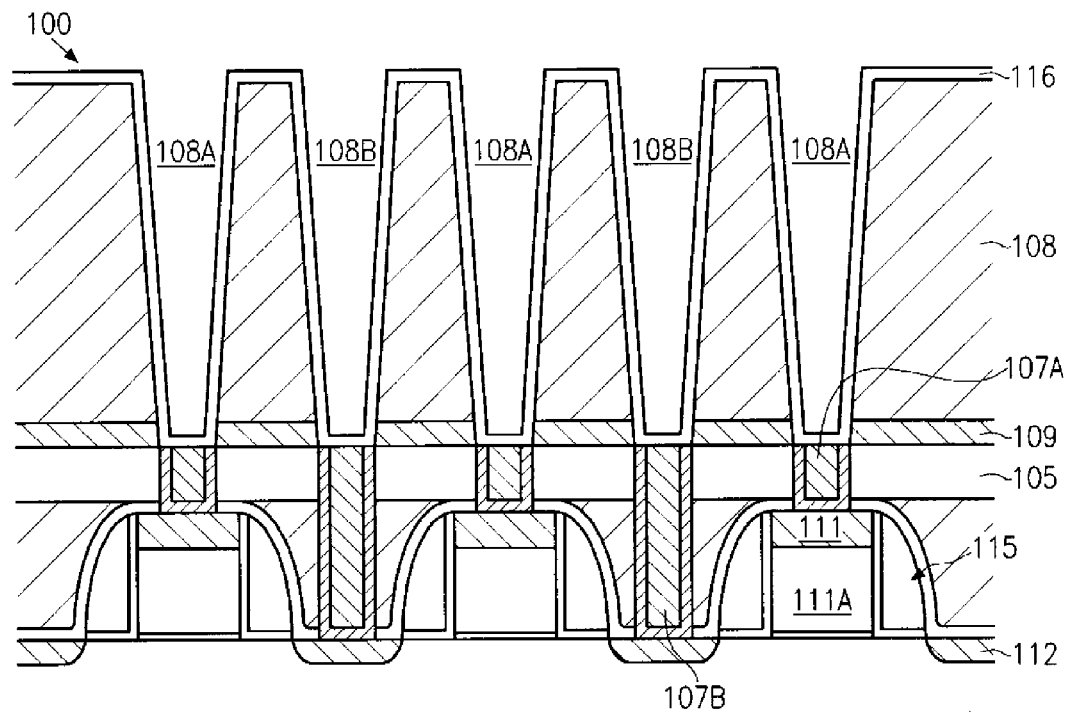

FIG. 1g schematically shows the semiconductor device 100 after completion of the above-described process sequence. Hence, the device 100 comprises a plurality of contact openings 108A, 108B, which connect, respectively, to the lower plug portions 107A, 107B. A further barrier layer 116 is formed on the layer 108 and within the contact openings 108A, 108B, which provides the required adhesion and copper diffusion blocking characteristics in order to substantially prevent undue copper diffusion into the surrounding dielectric material. For example, tantalum, tantalum nitride, titanium, titanium nitride, tungsten nitride and the like, or any combinations thereof, may be employed as an appropriate barrier material for receiving thereon a copper-based highly conductive metal.

The barrier layer 116 may be deposited on the basis of well-established techniques, such as sputter deposition, chemical vapor deposition (CVD) and the like. For highly sophisticated applications, in which the respective contact openings 108A, 108B have a high aspect ratio, advanced deposition techniques, such as ALD, may be employed in order to reliably cover the sidewall portions of the contact openings 108A, 108B while, nevertheless, forming the barrier layer 116 with a moderately thin thickness. For example, appropriate ALD techniques are established for tantalum nitride, tungsten nitride and the like. Moreover, due to the provision of the lower plug portions 107A, 107B, the coverage at bottom portions of the contact openings 108A, 108B is less critical, since the material of the lower plug portions 107A, 107B and the corresponding barrier material 106 may also act as an efficient copper-blocking barrier. Thus, during the formation of the barrier layer 116, respective re-sputter techniques may be used, thereby providing a reliable layer thickness at lower sidewall portions of the contact openings 108A, 108B substantially without risking any undue copper diffusion into sensitive device areas. In still other illustrative embodiments, the second dielectric layer 108 may itself be composed of a material that significantly suppresses the diffusion of copper, thereby even further reducing the probability of copper diffusion into sensitive device areas. For example, silicon nitride, silicon carbide, silicon oxynitride and nitrogen-enriched silicon carbide are known as efficient copper barriers and may be used for forming the second dielectric layer 108 when other dielectric characteristics thereof, such as relative permittivity and the like, are considered appropriate for the device under consideration.

After the formation of the barrier layer 116, copper or copper alloy may be filled into the contact openings 108A, 108B on the basis of well-established electrochemical deposition techniques, such as electroless plating or electroplating. To this end, in some illustrative embodiments, a seed layer (not shown), for instance comprised of copper, may be deposited on the basis of sputter deposition, electroless deposition and the like, followed by a further fill process on the basis of well-established electroplating techniques. Thereafter, any excess material of the copper or copper alloy along with excess material of the barrier layer 116 may be removed, for instance, on the basis of electropolishing techniques and CMP processes.

Figure 1H:
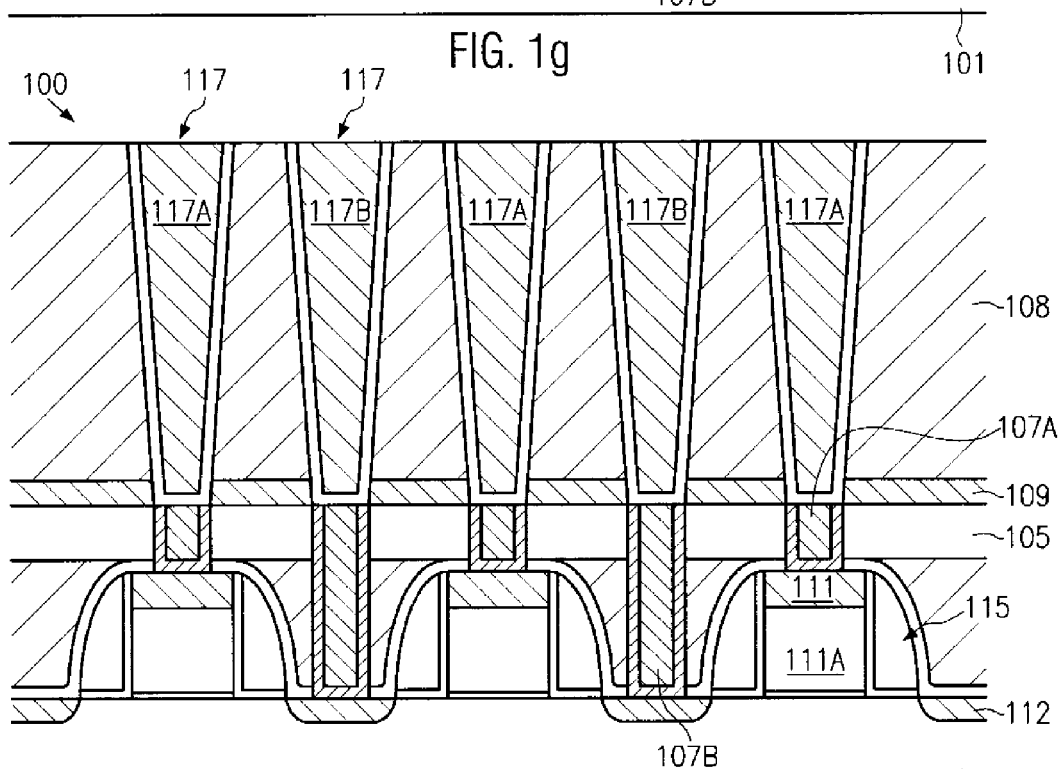

FIG. 1h schematically shows the semiconductor device 100 after the completion of the above-described process sequence. Thus, the device 100 comprises highly conductive upper plug portions 117A, 117B formed on the respective lower plug portions 107A, 107B. As a consequence, the contact plugs 117 of the device 100 formed by the respective lower plug portions 107A, 107B and the corresponding upper plug portions 117A, 117B provide a significantly reduced electrical resistance, since the essential portion of the contact plug 117 is formed of a highly conductive material, such as copper or a copper alloy. Moreover, due to the provision of the lower plug portions 107A, 107B, the presence of copper or copper alloys in the immediate vicinity of highly sensitive device areas may be avoided, thereby significantly reducing any risk of copper contamination and the failure of the circuit elements 110. Thereafter, the first metallization layer (not shown) may be formed above the upper plug portion.

With reference to FIGS. 2a-2h, further illustrative embodiments of the present invention will now be described in more detail, in which, in addition to forming a lower plug portion on the basis of a well-approved contact metal, the conductivity of gate electrodes or field effect transistors may be significantly enhanced simultaneously. For this purpose, after planarizing a first dielectric layer deposited above the circuit elements, the respective gate electrodes may be exposed and may be selectively treated to receive a highly conductive material therein or thereon.

Figure 2A:
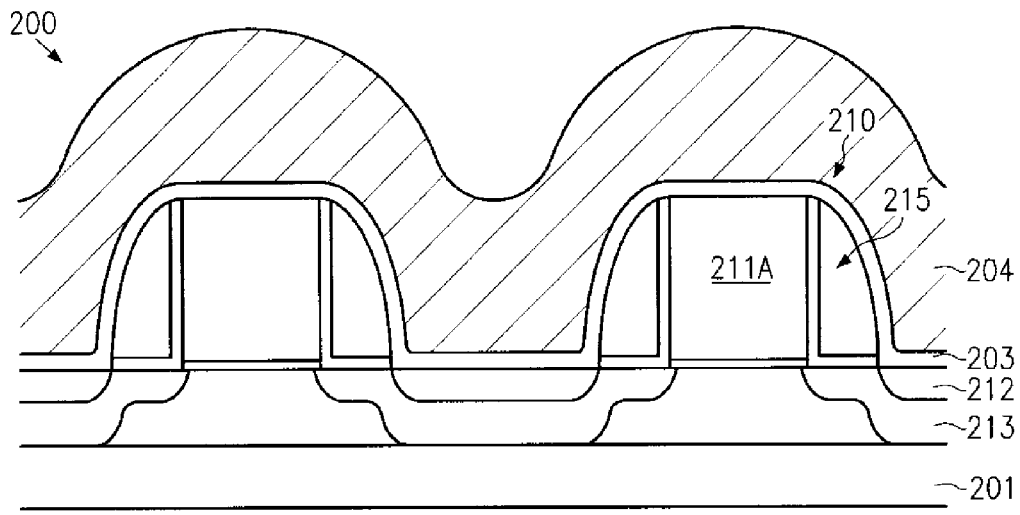
FIGS. 2a-2h schematically show cross-sectional views of a semiconductor device during the formation of highly conductive contact plugs in combination with an enhanced gate contact region in accordance with still further illustrative embodiments of the present invention.

FIG. 2a schematically shows a semiconductor device 200 in cross-sectional view, which may comprise a substrate 201 having formed thereon a crystalline semiconductor layer 202. With respect to the substrate 201 and the layer 202, substantially the same criteria apply as previously explained with reference to the substrate 101 and the layer 102. Moreover, in and on the layer 202, transistor elements 210 may be formed, which comprise a gate electrode 211A having formed at sidewalls thereof a respective sidewall spacer structure 215. Moreover, corresponding drain and source regions 213 may be located within the semiconductor layer 202, wherein respective contact regions 212 may be provided within the drain and source regions 213. It should be appreciated that, in some illustrative embodiments, the gate electrodes 211A may be provided in the form of doped polysilicon without any metal silicide formed therein. For this purpose, during the formation of any metal silicide in the drain and source regions 213, the gate electrodes 211A may have been covered by a corresponding capping layer, which may then have been removed or not, depending on the process requirements. In still other illustrative embodiments, the gate electrodes 211A may have formed thereon a metal silicide region (not shown) that may have been formed in accordance with conventional process techniques. Moreover, a liner 203 may be formed on the transistor elements 210 followed by a first dielectric layer 204, which may be deposited in such a way that at least sufficient excess material is provided that allows planarization of the layer 204 without unduly damaging the transistor elements 210. As previously explained, in advanced semiconductor devices, the usually used contact etch stop layer 203, for instance provided in the form of a silicon nitride layer, may already provide a corresponding surface topography, due to the reduced distance between neighboring transistor elements 210. It should be appreciated, however, that, irrespective of the distance between neighboring transistor elements 210, the first dielectric layer 204, which may be comprised of one or more different materials, may be formed so as to enable a subsequent planarization of the topography. Similar to the embodiments described above, the layer 204 may represent a stressed dielectric material, such as a silicon nitride material having compressive or tensile stress, wherein the tensile and compressive stress may be applied in a highly local fashion. For instance, the first dielectric layer 204 may be formed such that one of the transistor elements 210 may receive a compressive stress, while the other one of the transistors 210 may receive a tensile stress, if the transistors 210 represent a P-channel transistor and an N-transistor, respectively.

The semiconductor device 200 as shown in FIG. 2a may be formed on the basis of process techniques, as are also described with reference to the device 100 in FIG. 1a. Thereafter, the layer 204 may be planarized, for instance by CMP or any combination of etch techniques and CMP for reducing any excess material of the layer 204. During this planarization process, the gate electrodes 211A may be exposed, which may be accomplished by CMP or a subsequent selective etch process for selectively removing exposed portions of the layer 203 after a corresponding planarization process. For example, the planarization process may be performed in a similar way as is also described with reference to FIG. 1b, thereby maintaining at least a portion of the layer 203 above the gate electrodes 211A. Subsequently, a selective etch process may be carried out for removing the exposed layer portions of the layer 203, thereby also exposing the gate electrodes 211A. As previously discussed, depending on the previous process strategy, a corresponding doped polysilicon region or a respective metal silicide region may be exposed. For convenience, it may be assumed that, at this stage of manufacture, the gate electrodes 211A are substantially comprised of doped polysilicon without any metal silicide formed therein. Consequently, during the preceding manufacturing sequence, the respective contact regions 212, which may be comprised of a metal silicide, may be formed on the basis of process requirements that are specifically tailored to enhance the performance of the metal silicide regions 212 in the drain and source regions 213, without necessitating the consideration of any process specifics with respect to a metal silicide within the gate electrodes 211A.

Figure 2B:
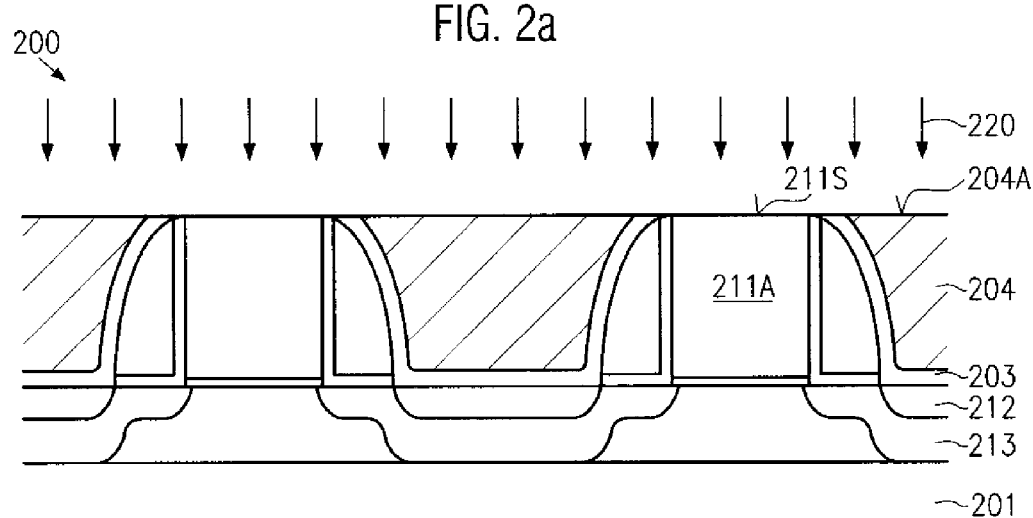

FIG. 2b schematically shows the semiconductor device 200 after the completion of the above-described process sequence. Consequently, the device 200 comprises a substantially planarized surface 204A with corresponding exposed surface portions 211S of the gate electrodes 211A. Moreover, the device 200 is shown to be exposed to a selective etch process 220, which is designed for selectively removing material from the gate electrode 211A. For example, the etch process 220 may be configured as a selective wet chemical etch process for selectively removing silicon material with respect to the material of the layer 204 and, in some illustrative embodiments, selectively to the spacer structure 215. It should be appreciated, however, that, in other embodiments, the spacer structure 215 may be at least partially removed along with material of the gate electrode 211A. Moreover, as previously explained, the etch process 220 may also remove material of a metal silicide, if the previous process sequence may be performed on the basis of a substantially non-masked gate electrode 211A during the silicidation process for forming the contact regions 212.

Figure 2C:
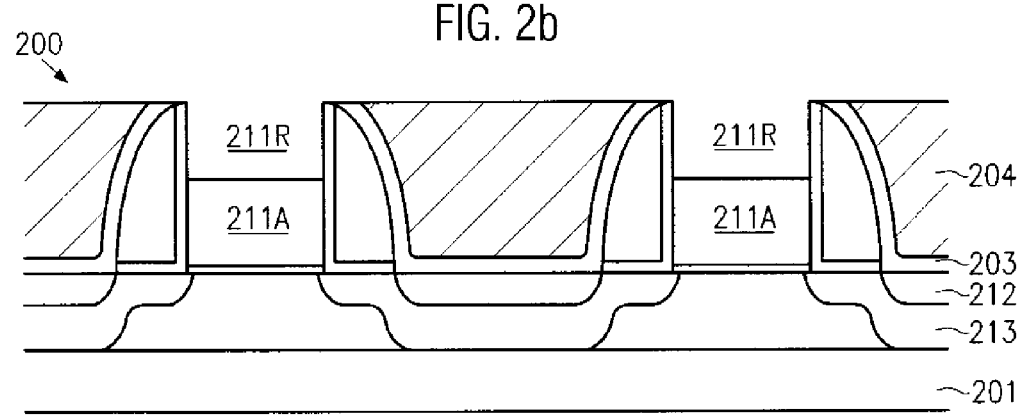

FIG. 2c schematically shows the semiconductor device 200 after the selective etch process 220, thereby providing respective recesses or openings 211R within the respective gate electrodes 211A. This etching process has the practical effect of reducing the thickness of the gate electrode. It should be appreciated that the recesses 211R are formed in a self-aligned fashion, thereby forming respective trenches extending along the entire extension of the gate electrodes 211A. Thus, contrary to the contact openings 111B (FIG. 1d), which expose the corresponding contact regions 111 at specified contact areas with respect to the width direction of the circuit elements 110 (the width direction of the devices 100 and 200 is perpendicular to the drawing planes of FIGS. 1a-1f and 2a-2f), the recesses 211R represent an upper portion of the entire gate electrodes 211A, thereby providing the potential for significantly enhancing the overall conductivity of the gate electrode 211A by providing an appropriate conductive material within the recesses 211R. In some illustrative embodiments, even if a highly conductive metal silicide is previously formed within the gate electrodes 211A, the recesses 211R may be formed to provide a significantly increased area for refilling the gate electrodes 211A with a highly conductive material, thereby significantly increasing the conductivity thereof and also decoupling a corresponding silicidation process for the contact regions 212 from any process requirements with respect to the gate electrodes 211A. Consequently, the size, i.e., the depth, of the recesses 211R may be controlled on the basis of process parameters of the etch process 220, wherein a certain amount of the initial gate electrode 211A may be maintained so as to not unduly degrade the integrity of an underlying gate insulation layer.

Figure 2D:
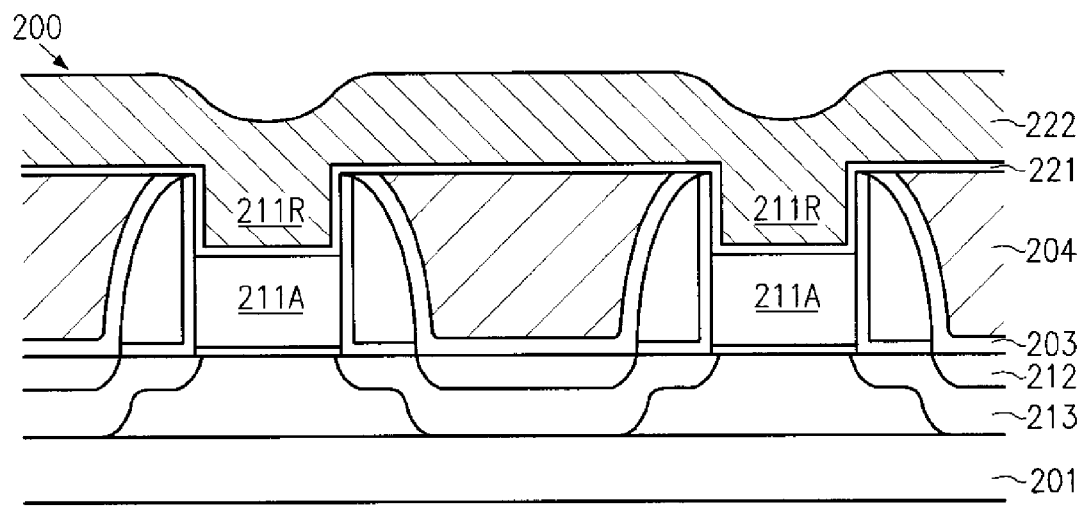

FIG. 2d schematically shows the semiconductor device 200 in a further advanced manufacturing stage. A first conductive layer 221 may be formed on the layer 204A and within the recesses 211R, wherein, in one illustrative embodiment, the first conductive layer 211 may represent a barrier layer, for instance comprised of titanium, titanium nitride, tungsten nitride and the like. In still other illustrative embodiments, the layer 221 may represent the layer of refractory metal, such as cobalt, nickel, tungsten and the like, which may be converted in a subsequent heat treatment into a metal silicide, thereby providing a buffer layer for a further conductive material layer 222 that may be provided to completely fill the recesses 211R. For example, the layer 222 may be comprised of tungsten or any other appropriate material.

In one illustrative embodiment, the first conductive layer 221 may be deposited on the basis of established techniques, such as sputter deposition, CVD and the like, wherein, when the layer 221 represents a refractory metal for the formation of a metal silicide buffer layer, a corresponding heat treatment may be subsequently performed to initiate a chemical reaction within the underlying silicon material of the gate electrodes 211A. For example, nickel may be deposited and converted into nickel silicide, wherein a process temperature may be maintained at approximately 400° C., thereby substantially not unduly affecting any metal silicide that may be provided in the contact region 212. In other illustrative embodiments, the first conductive layer 221 may be omitted, when the material of the layer 222 is considered appropriate for a direct deposition on the polysilicon material of the gate electrodes 211A. For example, the layer 222 may be deposited as an aluminum layer, which may form a sufficiently stable interface with the highly doped polysilicon material of the gate electrodes 211A. After the deposition of the second conductive layer 222, any excess material of the layers 222 and, if provided, of the layer 221 may be removed by any appropriate planarization technique, such as CMP, possibly in combination with any appropriate etch technique. After the planarization of the device 200 as shown in FIG. 2d, the further processing may be continued in a similar fashion as is also described with reference to FIG. 1c. That is, a corresponding buffer layer, such as the layer 105, may be formed above the planarized device 200, wherein, if required, an appropriate etch stop layer may be deposited prior to the formation of the corresponding buffer layer. Thereafter, the buffer layer may be patterned in accordance with the processes as are previously described with reference to the device 100. Consequently, the conductivity of the gate electrodes 211A may be significantly enhanced by providing a highly conductive material on an upper portion hereof.

Figure 2E:
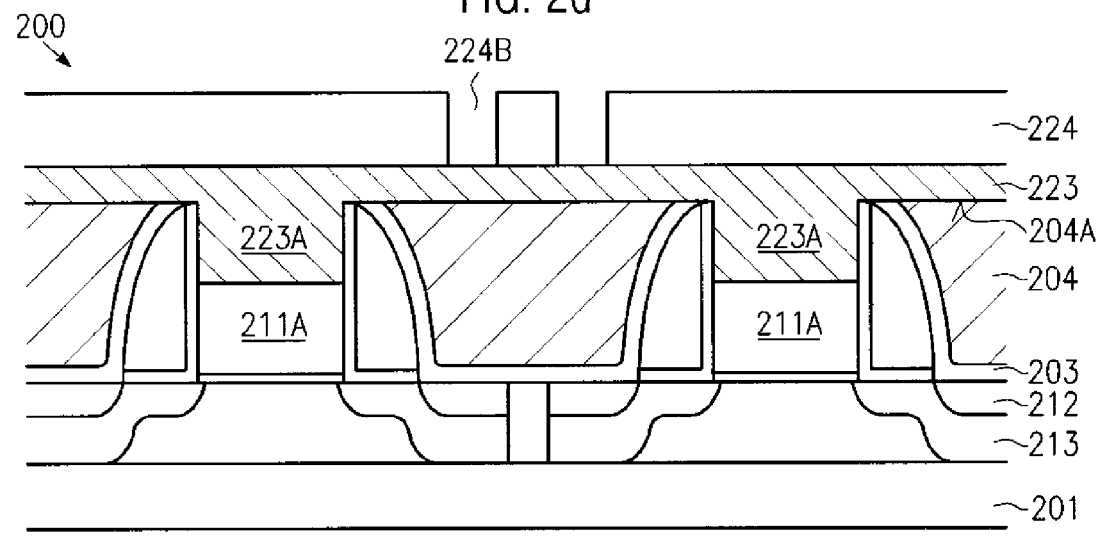

FIG. 2e schematically shows the semiconductor device 200 in accordance with other illustrative embodiments. In these embodiments, the recesses 211R (FIG. 2c) may be filled with an appropriate material, such as an organic polymer material, a photoresist and the like. Thus, corresponding plugs 223A may be formed within the recesses 211R, wherein, in some illustrative embodiments, the material of the plugs 223A may also serve as an antireflective coating (ARC), thereby forming a respective ARC layer 223 above the surface layer 204A. Moreover, a resist mask 224 may be formed on the ARC layer 223, including respective openings 224B that represent the size and shape of any contact openings to be formed within the first dielectric layer 204 to connect to the contact regions 212.

A typical process flow for forming the device 200 as shown in FIG. 2e may comprise an appropriate deposition process, for instance a spin-on technique, for forming the ARC layer 223 and the corresponding plugs 223A. For this purpose, well-established techniques may be modified and used, as are employed during the formation of metallization layers according to a dual damascene technique, in which vias are formed first and thereafter trenches are manufactured, wherein, in combination with the respective photolithography sequence, the vias are protected by spinning-on an appropriate viscous polymer material or photoresist material. Thereafter, the resist mask 224 may be patterned on the basis of advanced photolithography, wherein a lithography mask is employed that may be modified with respect to a corresponding lithography mask to be employed subsequently for the formation of upper plug portions. That is, at this stage, the resist mask may not include openings for connecting to the gate electrodes 211A. Subsequently, the ARC layer 223 and the layer 204 may be patterned on the basis of the resist mask 224 by an appropriately designed anisotropic etch process, for which well-established recipes may be used. That is, the layer 223 may be opened and it may be subsequently etched through the layer 204, wherein the corresponding etch process may be controlled on the basis of the liner 203, which may be subsequently opened after or prior to the removal of the resist mask 224, the ARC layer 223 and the plugs 223A. For example, in one illustrative embodiment, the portions of the liner 203 exposed by the previous etch process may be opened during or after the removal of the material of the ARC layer and the plugs 223A.

Figure 2F:
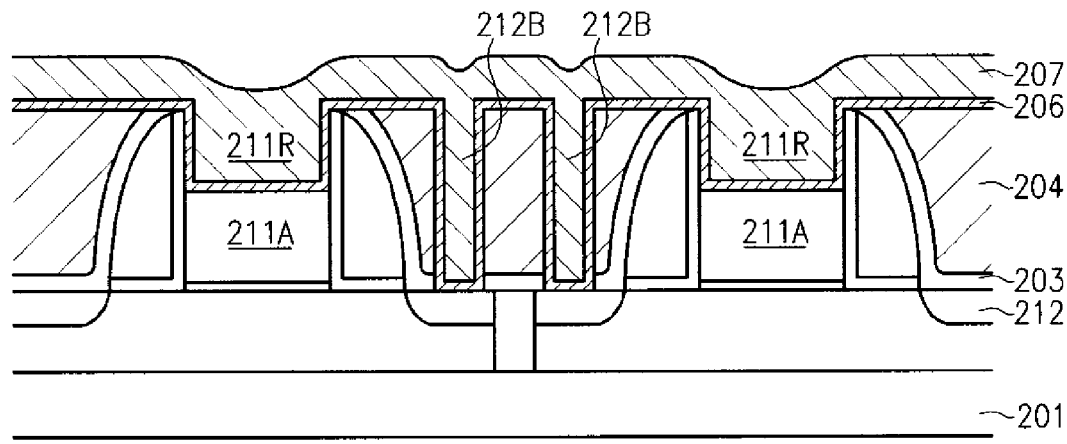

FIG. 2f schematically shows the semiconductor device 200 in a further advanced manufacturing stage after the completion of the above-described process sequence. The device 200 further comprises a barrier layer 206 formed on the layer 204 and within the recesses 211R and within respective contact openings 212B that have been formed during the preceding etch process on the basis of the etch mask 224. The barrier layer 206 may be comprised of any appropriate material, for instance, titanium nitride, titanium, tungsten nitride, tungsten, and any combination thereof, to provide the desired diffusion blocking and adhesion characteristics for a contact material of a layer 207 that is formed to completely fill the recesses 211R and the contact openings 212B. In one illustrative embodiment, the layer 207 is substantially comprised of tungsten.

The layers 206 and 207 may be formed on the basis of well-established recipes, including, for instance, a sputter deposition or CVD deposition of titanium and titanium nitride and/or an ALD deposition of tungsten nitride, followed by a CVD deposition, for instance on the basis of $WF_6$, when the layer is substantially comprised of tungsten. By providing the recesses 211R on upper portions of the gate electrodes 211A, a significant increase of conductivity may be achieved, wherein simultaneously an appropriate contact region is provided that may receive a copper-based upper plug portion, thereby also significantly reducing the probability of any undue copper diffusion into sensitive device areas. Moreover, due to the process sequence described above, the significant increase of conductivity in the gate electrodes 211A may be accomplished by a common deposition process for filling the respective contact openings 212B and the recesses 211R. Thereafter, any excess material of the layers 206 and 207 may be removed on the basis of well-established techniques such as CMP.

Figure 2G:
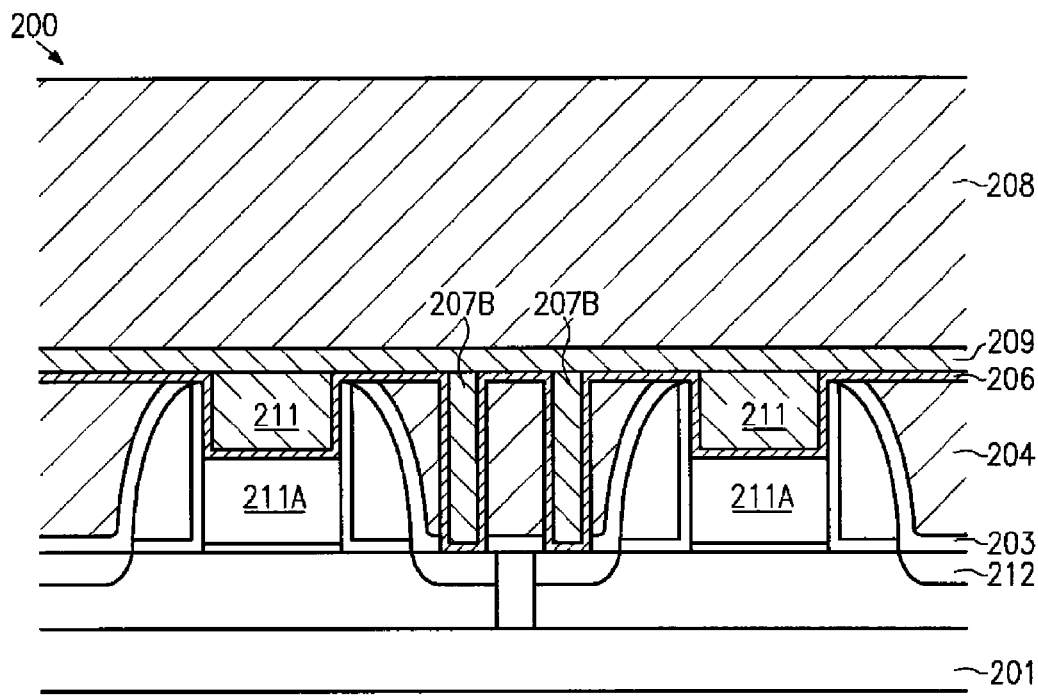

FIG. 2g schematically shows the semiconductor device 200 in a further advanced manufacturing stage. The device 200 now comprises contact regions 211 in the gate electrode 211A, wherein the contact regions 211 are formed of materials as may also be used in well-approved tungsten-based contact technology. Moreover, respective lower plug portions 207B are formed to connect to the respective contact regions 212. Furthermore, a second dielectric layer 208 may be formed above the circuit element 210, wherein, depending on process strategies, an etch stop layer 209 may be provided between the layer 208 and the layer 204 and the respective contact regions and lower plug portions 211, 207B, respectively. As previously explained with reference to device 100 and layers 108 and 109, any appropriate inter-layer dielectric material may be used for the layer 208, wherein, depending on the material of this layer, an appropriate material may be selected for the etch stop layer 209, if desired, so as to achieve a high etch selectivity in a subsequent patterning process for forming respective contact openings for upper plug portions in the dielectric layer 208.

Figure 2H:
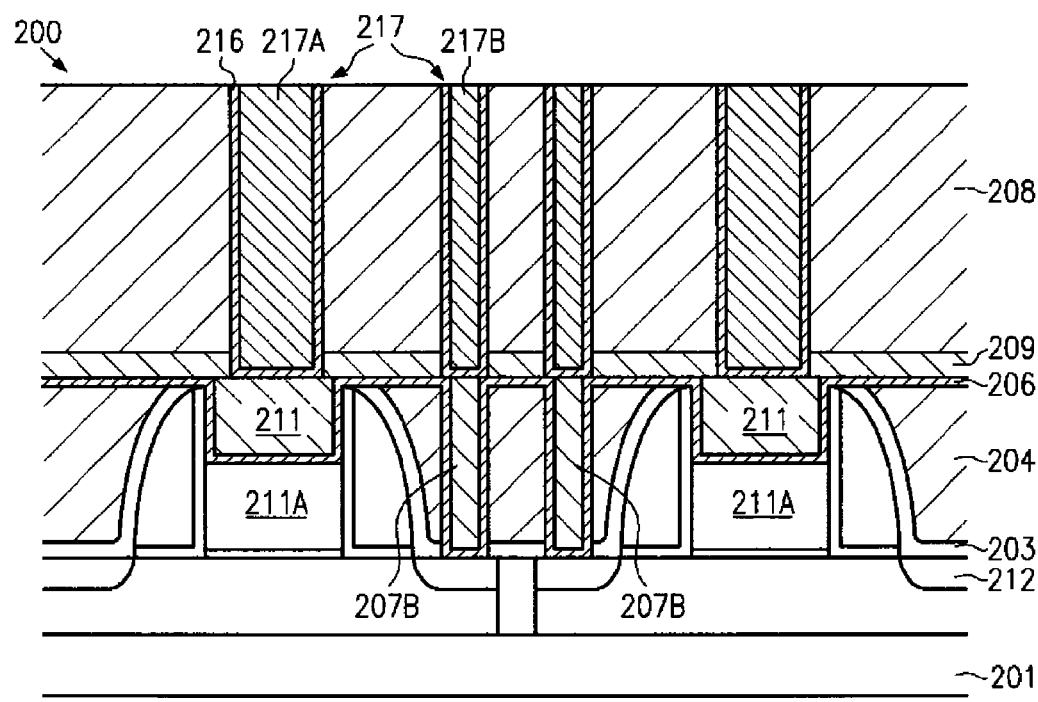

FIG. 2h schematically shows the semiconductor device 200 in a further advanced manufacturing stage. Hence, after the patterning of the second dielectric layer 208, a corresponding copper-based fill technique may be employed, as is also described with reference to FIG. 1h, so that corresponding upper plug portions 217B may be formed that connect to the corresponding lower plug portions 207B. Moreover, upper plug portions 217A are formed that connect to the contact regions 211, wherein, as previously described, an appropriate barrier layer 216, for instance on the basis of titanium, titanium nitride, tantalum, tantalum nitride, tungsten nitride and the like, may be used to avoid any copper diffusion into neighboring device areas. Due to the provision of contact plugs 217 in the form of a lower contact plug portion 207B or by providing a contact region 211 having substantially the same configuration as the lower plug portion 207B, a diffusion of copper into the drain and source regions 213 and the gate electrode 211A may be efficiently suppressed. Consequently, a significant increase of the overall conductivity of the contact plugs 217 is achieved, while simultaneously the conductivity of the gate electrode 211A is also remarkably enhanced, wherein a common manufacturing sequence for forming the lower contact plug portions 207B and the contact regions 211 may contribute to a reduced process complexity.

As a result, the present invention provides a technique that enables the combination of copper-free contact technologies, such as tungsten-based techniques, for forming lower plug portions, while the essential part of the contact plug may be formed on the basis of a copper technology, thereby significantly enhancing the overall performance of the contact structure. For this purpose, in highly advanced semiconductor devices having a highly scaled pitch between neighboring circuit elements, the conventional contact etch stop layer, that may also be used for stress transfer into respective channel regions, may already have to be deposited with a surface topography that allows a subsequent planarization and patterning of this layer. Consequently, an efficient manufacturing procedure may be applied so as to first pattern the planarized etch stop layer or first dielectric layer and subsequently deposit the main portion of the inter-layer dielectric material, which may then be patterned on the basis of inlaid techniques so as to fill the respective contact openings with a highly conductive copper-based material, wherein the lower contact plug portions may efficiently reduce the risk of copper contamination of sensitive device areas. In still other illustrative embodiments, a first dielectric layer of the inter-layer dielectric layer stack may be deposited and may be planarized irrespective of the corresponding technology node so as to form lower contact plug portions and then form respective upper plug portions in a second dielectric layer of the inter-layer dielectric material. Moreover, in some embodiments, the planarized surface topography prior to the formation of the lower contact plug portions may be used so as to also fill in a highly conductive material in the gate electrodes of transistor elements, thereby significantly contributing to a reduced gate resistance. In some illustrative embodiments, the formation of a highly conductive gate electrode material and the formation of the lower contact plug portions may be accomplished in a common process sequence.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
a circuit element having a contact region; and
a contact plug formed in a dielectric layer stack, said dielectric stack comprising a first planarized dielectric layer, a buffer layer above said first planarized dielectric layer, and a second dielectric layer above said buffer layer, said contact plug comprising a lower plug portion formed in said first planarized dielectric layer and said buffer layer and connecting to said contact region and an upper plug portion formed in said second dielectric layer and on said lower plug portion, said upper plug portion comprising copper.

2. The semiconductor device of claim 1, wherein said lower plug portion comprises tungsten.

3. The semiconductor device of claim 1, wherein said circuit element represents a transistor element and said lower plug portion connects to a drain or source region of said transistor element.

4. The semiconductor device of claim 3, further comprising a second contact plug connecting to a gate electrode of said transistor element, said second contact plug comprising a second lower plug portion that comprises tungsten and a second upper plug portion that comprises copper.

5. The semiconductor device of claim 3, further comprising a second contact plug connecting to a gate electrode of said transistor element, said second contact plug comprising copper separated from a contact material of said gate electrode by a barrier layer.

6. The semiconductor device of claim 1, wherein at least one of said first planarized dielectric layer or said buffer layer comprises a stress-inducing layer.

7. A method, comprising:
forming a first dielectric layer above a circuit element having a contact region;
planarizing said first dielectric layer;
forming a buffer layer on said planarized first dielectric layer;
forming a lower plug portion of a contact plug in said first dielectric layer and in said buffer layer;
forming a second dielectric layer above said first dielectric layer; and
forming a copper-comprising upper plug portion in said second dielectric layer.

8. The method of claim 7, wherein forming said lower plug portion comprises depositing a barrier layer, depositing a metal layer and removing excess material of said barrier layer and said metal layer.

9. The method of claim 8, further comprising depositing an etch stop layer on said buffer layer and forming thereon said second dielectric layer.

10. The method of claim 9, wherein forming said copper-comprising upper plug portion comprises patterning said second dielectric layer on the basis of said etch stop layer, etching said etch stop layer to expose a portion of said lower plug portion, depositing a barrier layer and filling in a copper-comprising metal.

11. The method of claim 7, wherein said circuit element comprises a gate electrode and wherein said method further comprises exposing a portion of said gate electrode prior to forming said lower plug portion.

12. The method of claim 11, wherein said portion of said gate electrode is exposed when planarizing said first dielectric layer.

13. The method of claim 11, further comprising forming a recess in said gate electrode via said exposed portion of said gate electrode.

14. The method of claim 13, further comprising refilling said recess with a conductive material.

15. The method of claim 14, wherein refilling said recess comprises performing a silicidation process.

16. The method of claim 14, further comprising patterning said first dielectric layer to form an opening for said lower plug portion, and wherein refilling said recess comprises depositing a metal-containing material and removing excess material prior to patterning said first dielectric layer.

17. The method of claim 14, wherein refilling said recess comprises patterning said first dielectric layer to form an opening for said lower plug portion and filling said recess and said opening in a common deposition process.

18. The method of claim 17, wherein patterning said first dielectric layer comprises filling said recess by a sacrificial material so as to provide a substantially planar surface and forming a resist mask above said substantially planar surface.

19. The method of claim 7, wherein a process temperature is maintained at approximately 400° C. or less.

20. A method, comprising:
forming a first dielectric layer above a circuit element having a contact region;
planarizing said first dielectric layer;
forming a lower plug portion of a contact plug in said first dielectric layer;
forming a second dielectric layer above said first dielectric layer;
forming a copper-comprising upper plug portion in said second dielectric layer; and
wherein a process temperature is maintained at approximately 400° C. or less.

21. The method of claim 20, wherein forming said lower plug portion comprises depositing a barrier layer, depositing a metal layer, and removing excess material of said barrier layer and said metal layer.

22. The method of claim 21, further comprising:
depositing an etch stop layer on said first dielectric layer; and
forming said second dielectric layer on said etch stop layer, wherein forming said copper-comprising upper plug portion comprises:
patterning said second dielectric layer on the basis of said etch stop layer;
etching said etch stop layer to expose a portion of said lower plug portion;
depositing a barrier layer; and
filling in a copper-comprising metal.

23. The method of claim 20, wherein said circuit element comprises a gate electrode and wherein said method further comprises exposing a portion of said gate electrode prior to forming said lower plug portion.

24. The method of claim 23, wherein said portion of said gate electrode is exposed when planarizing said first dielectric layer.

25. The method of claim 24, further comprising:
forming a recess in said gate electrode via said exposed portion of said gate electrode; and
refilling said recess with a conductive material.

26. The method of claim 25, wherein refilling said recess comprises performing a silicidation process.

27. The method of claim 26, wherein refilling said recess comprises depositing a metal-containing material and removing excess material prior to patterning said first dielectric layer.

28. The method of claim 26, wherein refilling said recess comprises patterning said first dielectric layer to form an opening for said lower plug portion and filling said recess and said opening in a common deposition process.

29. The method of claim 28, wherein patterning said first dielectric layer comprises filling said recess by a sacrificial material so as to provide a substantially planar surface and forming a resist mask above said substantially planar surface.

30. A method, comprising:
forming a first dielectric layer above a circuit element having a contact region, wherein said circuit element comprises a gate electrode;
planarizing said first dielectric layer to expose a portion of said gate electrode;
forming a recess in said gate electrode via said exposed portion of said gate electrode;
refilling said recess with a conductive material by performing a silicidation process;
forming a lower plug portion of a contact plug in said first dielectric layer after planarizing said first dielectric layer;
forming a second dielectric layer above said first dielectric layer; and
forming a copper-comprising upper plug portion in said second dielectric layer.

31. The method of claim 30, wherein forming said lower plug portion comprises depositing a barrier layer, depositing a metal layer, and removing excess material of said barrier layer and said metal layer.

32. The method of claim 31, further comprising:
depositing an etch stop layer on said first dielectric layer; and
forming said second dielectric layer on said etch stop layer, wherein forming said copper-comprising upper plug portion comprises:
patterning said second dielectric layer on the basis of said etch stop layer;
etching said etch stop layer to expose a portion of said lower plug portion;
depositing a barrier layer; and
filling in a copper-comprising metal.

33. The method of claim 30, wherein refilling said recess comprises patterning said first dielectric layer to form an opening for said lower plug portion and filling said recess and said opening in a common deposition process.

34. The method of claim 33, wherein patterning said first dielectric layer comprises filling said recess by a sacrificial material so as to provide a substantially planar surface and forming a resist mask above said substantially planar surface.

35. A method, comprising:
forming a first dielectric layer above a circuit element having a contact region, wherein said circuit element comprises a gate electrode;

planarizing said first dielectric layer to expose a portion of said gate electrode;

forming a recess in said gate electrode via said exposed portion of said gate electrode;

refilling said recess with a conductive material by depositing a metal-containing material and removing excess material;

patterning said first dielectric layer to form an opening after refilling said recess;

forming a lower plug portion of a contact plug in said opening in said first dielectric layer after planarizing said first dielectric layer;

forming a second dielectric layer above said first dielectric layer; and forming a copper-comprising upper plug portion in said second dielectric layer.

36. The method of claim 35, wherein forming said lower plug portion comprises depositing a barrier layer, depositing a metal layer, and removing excess material of said barrier layer and said metal layer.

37. The method of claim 36, further comprising:
depositing an etch stop layer on said first dielectric layer; and forming said second dielectric layer on said etch stop layer, wherein forming said copper-comprising upper plug portion comprises:

patterning said second dielectric layer on the basis of said etch stop layer;

etching said etch stop layer to expose a portion of said lower plug portion;

depositing a barrier layer; and filling in a copper-comprising metal.

* * * * *